United States Patent
Staggers et al.

(10) Patent No.: US 6,404,636 B1
(45) Date of Patent: Jun. 11, 2002

(54) PASSIVELY OPERATED THERMALLY DIODIC PACKAGING METHOD FOR MISSILE AVIONICS

(75) Inventors: David D. Staggers; Stephen L. Ballou, both of Tucson, AZ (US); Edmund A. Singer, Coon Rapids, MN (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/774,861

(22) Filed: Jan. 31, 2001

(51) Int. Cl.$^7$ ................................................. H05K 7/20
(52) U.S. Cl. ........................ 361/704; 361/688; 361/707; 257/706; 257/718; 257/719; 165/80.2; 165/96; 165/185
(58) Field of Search ................................. 361/687–690, 361/703, 704, 708, 717–721; 257/718, 719, 727; 174/16.3; 165/80.2, 104.33, 185

(56) References Cited

U.S. PATENT DOCUMENTS

| | | | |
|---|---|---|---|
| 5,313,362 A | * 5/1994 | Hatada et al. | 361/709 |
| 5,535,815 A | * 7/1996 | Hyman | 165/32 |
| 5,774,333 A | * 6/1998 | Janik et al. | 361/687 |

FOREIGN PATENT DOCUMENTS

JP   363226952 A  * 9/1988 ................. 257/714

* cited by examiner

Primary Examiner—Leo P. Picard
Assistant Examiner—Boris L. Chervinsky
(74) Attorney, Agent, or Firm—Colin M. Raufer; Leonard A. Alkov; Glenn H. Lenzen, Jr.

(57) ABSTRACT

A passively operated thermal diode for controlling heat transfer from heat-generating electronic components to an external environment through an airframe is provided. The thermal diode comprises: (a) an electronics package within the airframe; (b) a heat-transferring mechanism thermally connected to the electronics package and controllably disengagable from thermal contact with the airframe at a predetermined temperature; (c) a shape-memory alloy component having a phase change at the predetermined temperature for thermally disconnecting the electronics package from the airframe once the predetermined temperature is exceeded; and (d) a spring for maintaining the heat-transferring mechanism in thermal contact the airframe below the predetermined temperature. The present invention solves the problem of heat transfer by introducing a shape-memory-alloy sensor-actuator component. It deforms due to a temperature initiated phase change, thereby providing the force and motion required to change the mechanical connection between the missile avionics and the airframe from a thermally conductive path to a thermally insulating path.

5 Claims, 4 Drawing Sheets

PASSIVELY OPERATED THERMALLY DIODIC PACKAGING METHOD FOR MISSILE AVIONICS

CROSS-REFERENCE TO RELATED APPLICATION

The present application is related to application Ser. No. 09/389,655, filed Sep. 2, 1999, which discloses and claims a heat conducting device for providing a thermal path between avionics e.g., a circuit board, and an airframe. In one embodiment, a collar encompassing at least a portion of a thermal plane adapted to receive the circuit board has a first position to disengage it from at least a portion of the airframe and a second position to provide a thermal path between the circuit board and the airframe.

TECHNICAL FIELD

The present invention relates generally to heat conducting devices, and, more particularly, to passive heat conduction devices that act analogously to electrical diodes, that is, allowing heat to pass in a first configuration and preventing heat from passing in a second configuration.

BACKGROUND ART

Circuit boards in missiles contain electronic components mounted on and through the circuit board. The electronics themselves generate heat, and the circuit board may also experience an influx of aerodynamic heat through the airframe of the missile during high speed flight. Both internal and external sources of heat may degrade the operation of the circuit board and the electronics, by increasing their operating temperature.

In many older missiles, the influx of heat during high speed flight was the primary concern, because the electronics did not produce large amounts of heat during limited flight times. Accordingly, missiles that had short-duration, high-speed flights were designed to limit the influx of heat during that mode of operation. These designs, however, did not allow for the removal of heat from the missile. Thus, as the electronics have become more complex and have begun to operate for longer periods of time, internal heat build-up has become a concern, as well. Thus, circuit boards in some modern missiles may generate significant internal heat and also experience significant heating from the airframe during high speed flight.

Specifically, present-day missile systems are being asked to operate under harsh environments with increasingly high power densities and longer operating times. For reliability, electronic components must be maintained below certain temperature limits (typically 110° Celsius junction temperatures). Increasing power density and increasing performance requirements make staying within these limits increasingly difficult. Many of the environments under which a missile is asked to operate for extended periods provide the opportunity to reject this heat through the airframe, or missile skin. Such a heat rejection requires a good thermal path to the missile skin. Examples include production testing, high altitude/low speed captive carry, and field reprogramming. The ultimate operational environment is, however, very harsh thermally, providing high heating to the missile skin. Examples include high speed dash in captive carry of airborne missiles and free flight in most all missiles. This environment calls for thermal isolation of the internal components from the missile skin.

The goals of a good thermal path to the missile skin for long-term operation and thermal isolation for short term operation in free flight are directly at odds, unless a thermal diode can be developed which allows unrestricted heat-flow in one direction (out of missile) and highly restricted heat flow in the other direction (into missile).

Application Ser. No. 09/389,655, filed on Sep. 2, 1999, entitled "Heat Conducting Device for a Circuit Board" and assigned to the same assignee as the present invention, discloses and claims one solution to the above-discussed problems. That solution comprises a heat conducting device with a low thermal impedance to the environmental sink for the heat generated by the electronics in the circuit board in one mode of operation of the missile and a high thermal impedance to environmental source for the heat generated by the aerodynamics on the airframe in another mode of operation of the missile. Thus, the claimed solution comprises a thermal diode. However, while the claimed invention is certainly useful for its intended purpose, work continues in an effort to develop improved thermal diodes. In particular, because the '655 application is not a passive device and requires some sort of control logic, it is desirable to provide a passive, self-contained sensor-actuator system that does not require a separate sensor, control system, and actuator.

DISCLOSURE OF INVENTION

In accordance with the present invention, a passively operated thermal diode for controlling heat transfer from heat-generating electronic components to an external environment through an airframe, or missile skin, is provided. The thermal diode comprises:

an electronics package within the airframe;

a heat-transferring mechanism thermally connected to the electronics package and controllably disengagable from thermal contact with the airframe at a predetermined temperature;

a shape-memory alloy component having a phase change at the predetermined temperature for thermally disconnecting the electronics package from the airframe once the predetermined temperature is exceeded; and a spring for maintaining the heat-transferring mechanism in thermal contact the airframe below the predetermined temperature.

In one embodiment, the electronics package is provided with at least one first tapered surface. The heat-transferring mechanism is provided with at least one second tapered surface that slidably mates with the first tapered surface(s) and a cylindrical face that mates with the missile skin. The shape-memory component comprises an actuator for moving the heat-transferring mechanism out of thermal contact with the missile skin once the predetermined temperature is exceeded. The spring, e.g., a Belleville spring, maintains the heat-transferring mechanism in thermal contact with the first tapered surface and the missile skin below the predetermined temperature.

In a second embodiment, a portion of an inner surface of the airframe is provided with two tapered surfaces, a first tapered surface having a comparatively large contact area and a comparatively shallow taper and a second tapered surface having a comparatively small contact area and a comparatively steep taper. The electronics package is thermally connected to a heat sink also provided with two tapered surfaces, a third tapered surface having a comparatively large contact area and a comparatively shallow taper and a fourth tapered surface having a comparatively small contact area and a comparatively steep taper. The heat sink is configured (1) with its third tapered surface opposed to the first tapered surface and with its fourth tapered surface opposed to the second tapered surface and (2) to slidably move from contact of the first and third surfaces to contact of the second and fourth surfaces. The shape-memory alloy component comprises a washer for moving the heat sink out of thermal contact with the first tapered surface once the predetermined temperature is exceeded. The spring comprises a spring-loaded washer for maintaining the heat sink in thermal contact with the first tapered surface below the predetermined temperature.

The present invention solves the problem of heat transfer by introducing a shape-memory-alloy sensor-actuator component. The SMA component deforms due to a temperature-initiated phase change, thereby providing the force and motion required to change the mechanical connection between the missile avionics and the airframe from a thermally conductive path to a thermally insulating path.

Thus, the present invention provides a passive, self-contained sensor actuator system that does not require a separate sensor, control system, and actuator.

The application of this technology to the thermal management of missile electronics has significant potential for all missiles. Thermal management of missile electronics must strike the balance between good coupling with the environment (for captive carry, flight line testing, and production test) and isolation from the environment (to minimize the impact of aerothermal heating during free flight). Traditionally, this has been accomplished by tailoring thermal conductance paths and managing thermal mass to passively achieve the goals of survival during long-term/low-temperature and short-term/high-temperature operating conditions. However, as the power density of electronics packages increases, this approach is not adequate, and more advanced techniques must be developed.

The approach disclosed herein offers a solution that has the potential to greatly expand the allowable operating envelopes of missile electronics. In terms of missile performance, this means;

Longer allowable run-times and shorter cooldown times during operation, leading to decreased cycle time.

Higher allowable electronics power dissipation associated with increased functionality.

Expanded allowable captive-carry flight speed and endurance envelope.

Increased allowable flight time and speed which increase stand-off distance.

The present invention is a passive extension and improvement to the invention disclosed and claimed in the above-referenced related patent application. However, it is very different from previously implemented missile electronics packaging techniques in that most previous techniques use isolation of the internal components in order to survive free flight. This, however, limits captive carry and ground test operation, and requires long non-operational cool down times. Rather, the present invention extends the system of the related patent application because it is passive and does not require an active sensor, control and actuation system.

BRIEF DESCRIPTION OF THE DRAWINGS

FIG. 3b is an enlargement of a portion of FIG. 3a;

FIG. 4b is an enlargement of a portion of FIG. 4a;

BEST MODES FOR CARRYING OUT THE INVENTION

The present invention takes advantage of the fact that heat transfer by conduction is proportional to the area through which the heat is conducted. It uses the novel characteristic of shape memory alloys, such as nickel-titanium, to provide a passive sensor-actuator to change the heat conduction path. Shape memory alloys can be formed into a variety of shapes above their phase transition temperature. Below their phase transition temperatures, they can then be deformed to another shape. With proper processing, however, they will recover their original high-temperature shape when reheated. Some shape memory alloys can be processed so that they will transform back and forth between their low-temperature and high temperature shapes repeatedly. Thus, a part constructed of shape memory alloy can act as an integrated thermal sensor and actuator in one part. This eliminates the need for a control system to interpret the output of a sensor and provide the appropriate output to an actuator, greatly simplifying the system.

The resulting structure is referred to herein as a passively operated thermally diodic packaging; that is, the package operates in two states, OPEN or CLOSED, depending on the state of the shape memory alloy.

Figure 1:
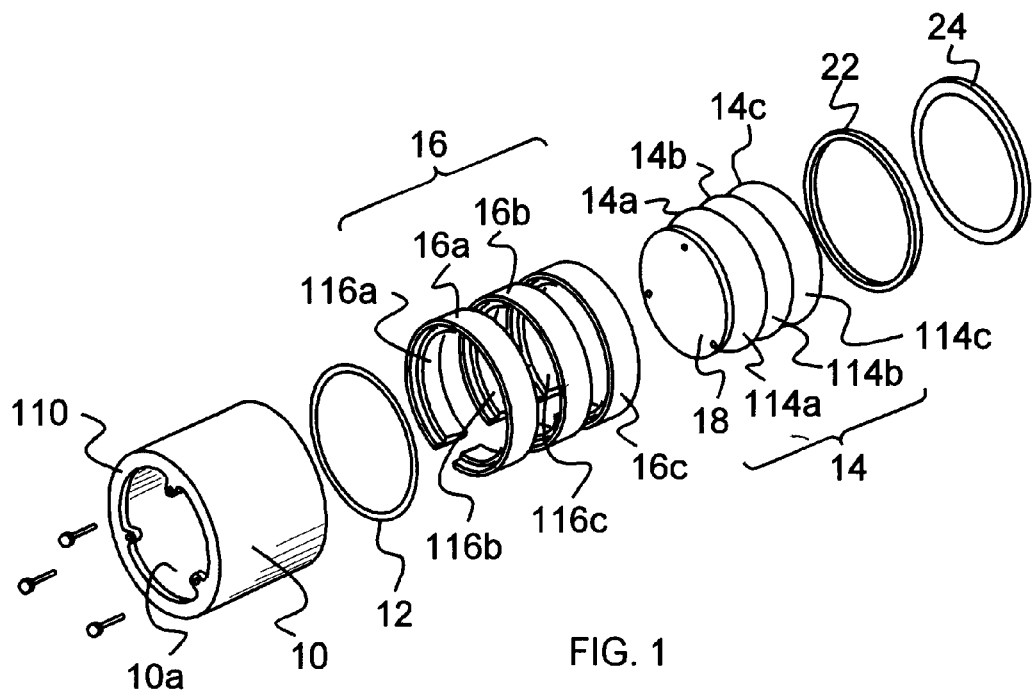
FIG. 1 is an exploded view, showing the elements used in the assembly of the thermal diode of the present invention.

One embodiment of the present invention is shown in FIGS. 1–4. FIG. 1 shows an exploded view of the thermal diode of the present invention for mounting on the inside surface 10a of a missile skin, or airframe, 10. An electronics package 14 is bolted to the bulkhead 110 of the missile skin 10. The thermal path here is limited by the small contact area. A Belleville washer 12 forces wedges 16 into contact between the missile skin 10 and the electronics package 14 when the shape-memory actuator 22 is in a cold state (FIGS. 3a and 3b).

The electronics package 14 comprises a plurality of sections 14a, 14b, 14c, each of which has a corresponding tapered surface 114a, 114b, 114c. A plurality of wedges 16 each comprise a split ring, with an inner tapered surface 116a, 116b, 116c that mates with a corresponding tapered surface 114a, 114b, 114c of the electronics package 14. The wedges 16 are slidably movable along the tapered surfaces of the electronics package 14. There are the same number of wedges 16 as there are number of sections of the electronics package 14, and the number of sections and wedges can be varied, as required for the particular missile. The SMA actuator 22 is located between a retainer ring 24 and the last wedge 16c.

Figure 2:
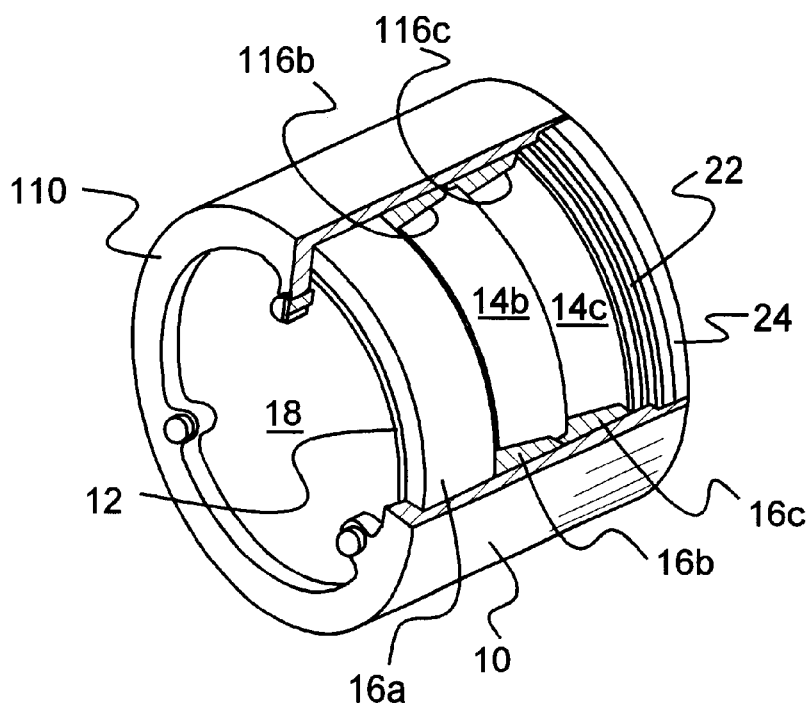
FIG. 2 is a perspective view, in partial section, showing the assembled elements of FIG. 1.

FIG. 2 shows a partially sectioned assembled view, showing two sections 14b, 14c of the electronics package 14 (the first section 14a is covered by a wedge 16a). The sections are encompassed by a corresponding wedge 16a, 16b, 16c.

Figure 3A:
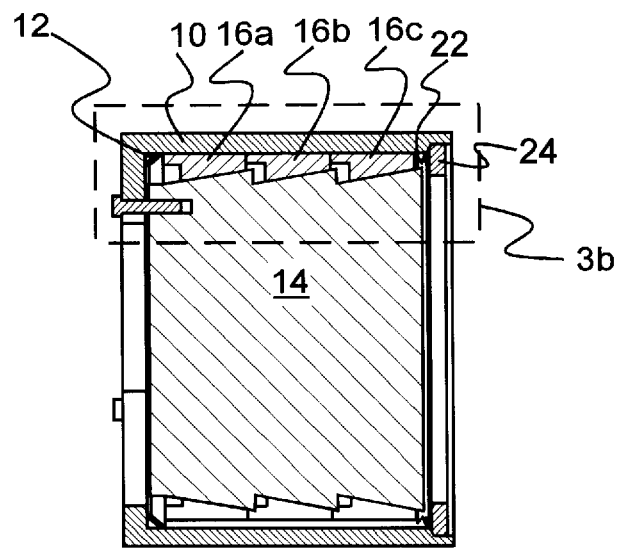
FIG. 3a is a cross-sectional view of the assembly in the cold state.
Figure 3B:
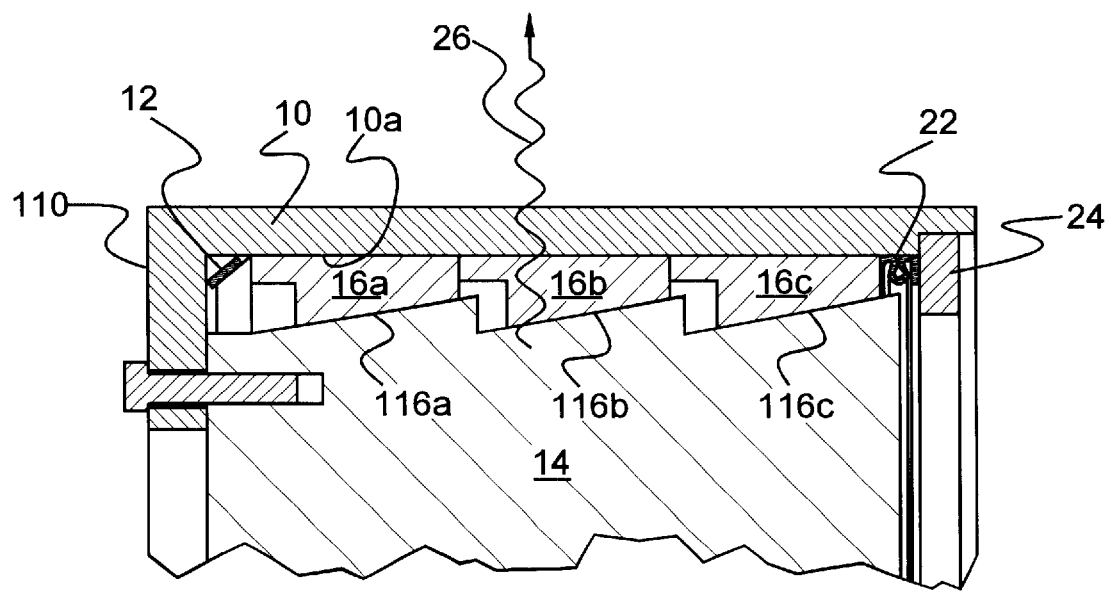

FIGS. 3 and 4 illustrate how the thermal diode of the present invention operates. In FIGS. 3a and 3b, the missile skin, or airframe, 10 and its environment are cool, allowing heat to be transferred out of the electronics assembly 14 through the skin and into the environment. It will be seen that the SMA actuator component 22 is retracted and the Belleville spring 12 holds the wedges 16 in contact with the skin 10 and the electronics assembly 14. Heat is transferred out to a relatively cool environment as illustrated by curved arrow 26.

Figure 4A:
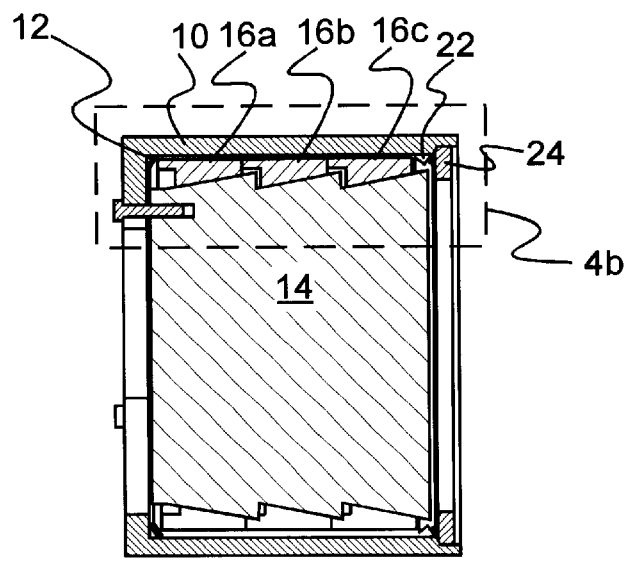
FIG. 4a is a cross-sectional view of the assembly in the hot state.
Figure 4B:
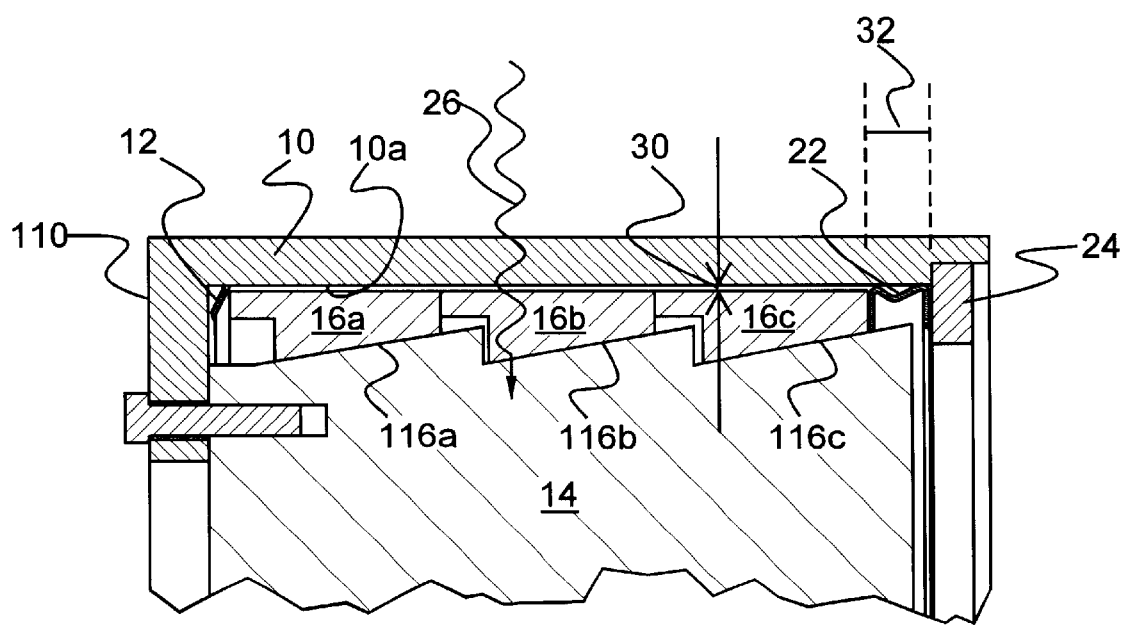

FIGS. 4a and 4b show the state of the system after the skin has heated up due to external heating from a high-speed dash or free flight. The SMA actuator 22 has also heated up and has extended, forcing the wedges 16 out of contact with the skin 10. This impedes the transfer of heat into the missile electronics 14 along the curved arrow 28. The wedges 16a, 16b, 16c slide along the tapered surfaces 114a, 114b, 114c, respectively, of the electronics package 14 to form a gap 30 between the wedges 16 and the electronics package 14. The SMA actuator 22 expands when heated above its phase change temperature. The expanded length is denoted at 32. The phase change temperature can be tailored for a specific application by changing the composition and processing of the SMA actuator 22.

In this embodiment, the shape of the SMA actuator 22 is similar to that of a washer, but with a convoluted surface (S-shaped in cross-section), as seen more clearly in FIGS. 3b and 4b. Expansion and contraction occur axially. The shape of the SMA actuator 22, however, is not critical, and shapes other than that depicted are also possible. Indeed, the SMA actuator 22 could be shaped as a flat washer that transforms to a Belleville or as a wave washer or as a toothed lock washer. Further, non-washer embodiments are possible.

The following Table lists a number of different alloys having a shape memory effect, a number of which could be suitably employed in the practice of the present invention. The data in this Table is taken from D. E. Hodgson et al, "Shape Memory Alloys", available at the URL site http://www.sma-inc.com/SMAPaper.html.

TABLE

Alloys Having a Shape Memory Effect.

| Alloy | Composition | Transformation Temperature Range, ° C. | Transformation Hysteresis, ° C. |
|---|---|---|---|
| Ag-Cd | 44/49 at % Cd | −190 to −50 | ca. 15 |
| Au-Cd | 46.5/50 at % Cd | 30 to 100 | ca. 15 |
| Cu-Al-Ni | 14/14.5 wt % Al 3/4.5 wt % Ni | −140 to 100 | ca. 35 |
| Cu-Sn | ca. 15 at % Sn | −120 to 30 | |
| Cu-Zn | 38.5/41.5 wt % Zn | −180 to −10 | ca. 10 |
| Cu-Zn-X (X = Si, Sn, Al) | few wt % of X | −180 to 200 | ca. 10 |
| In-Ti | 18/23 at % Ti | 60 to 100 | ca. 4 |
| Ni-Al | 36–38 at % Al | −180 to 100 | ca. 10 |
| Ni-Ti | 49/51 at % Ni | −50 to 110 | ca. 30 |
| Fe-Pt | ca. 25 at % Pt | ca. −130 | ca. 4 |
| Mn-Cu | 5/35 at % Cu | −250 to 180 | ca. 25 |
| Fe-Mn-Si | 32 wt % Mn, 6 wt % Si | −200 to 150 | ca. 100 |

A specific preferred alloy useful in the practice of the present invention includes NiTi. Another possible alloy is AuCd. The particular alloy and composition are optimized, depending on the specific application, i.e., the specific missile configuration and components to be protected. In general, a transition temperature in the range of about 70° to 80° C. is useful.

Figure 5A:
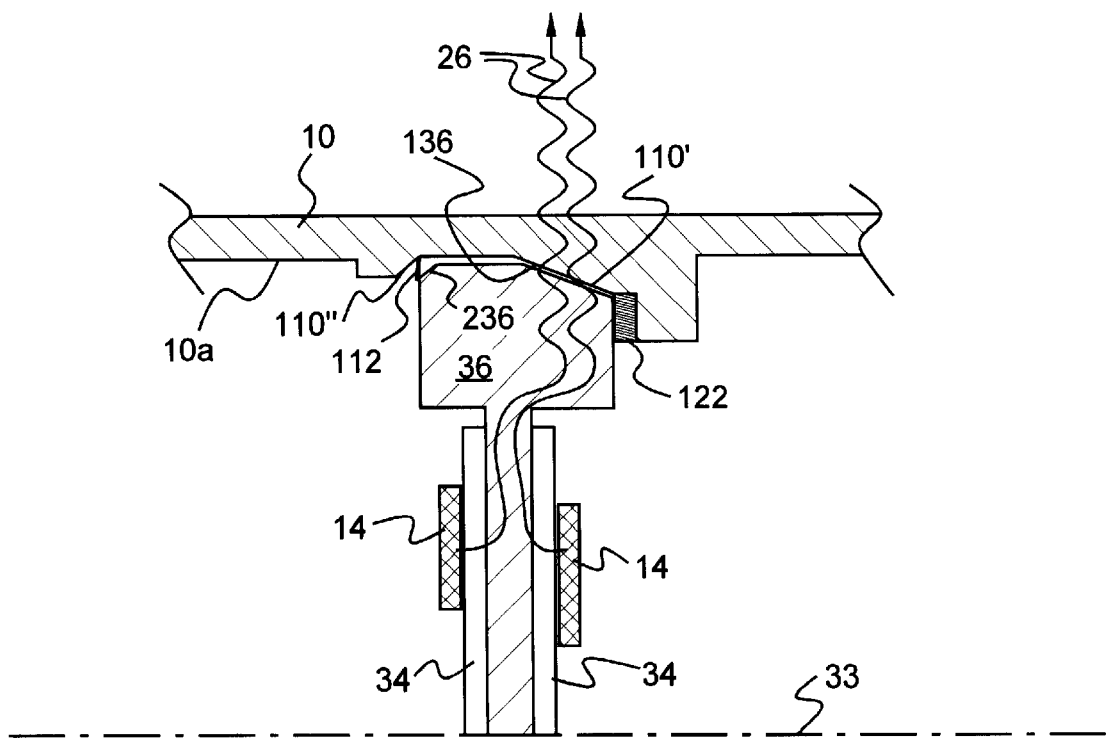
FIG. 5a is a cross-sectional view of an alternative embodiment of the assembly in the cold state.
Figure 5B:
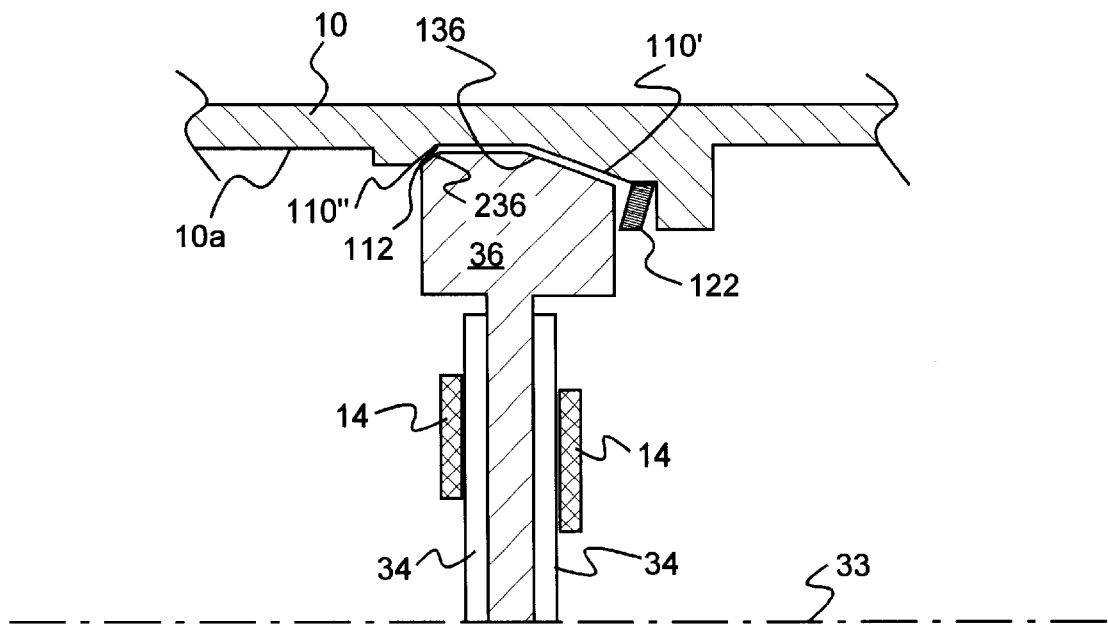
FIG. 5b is a cross-sectional view of the alternative embodiment of FIG. 5a in the hot state.

Another embodiment of the shape-memory alloy actuated system is shown in FIGS. 5a–5b. While FIGS. 3–4 depicted the entire diameter of the missile, FIG. 5 shows only half the diameter, as denoted by the missile centerline 33.

In this embodiment, a shape-memory alloy washer 122 is used in conjunction with a Belleville washer 112. A portion of the interior surface 110 of the skin 10 is provided with two tapered surfaces 110', 110". The first tapered surface 110' is comparatively large and of a comparatively shallow taper, while the second tapered surface 110" is comparatively small and of a comparatively steep taper.

A number of electronic components 14 are mounted on printed wiring boards 34, each of which is secured to a shaped heatsink assembly 36. A portion of the shaped heatsink assembly 36 is provided with two tapered surfaces 136, 236. The first tapered surface 136 is comparatively large and of a comparatively shallow taper, while the second tapered surface 236 is comparatively small and of a comparatively steep taper. The tapered surface 136 mates with the tapered surface 110' of the interior surface 110 when the heatsink 36 is urged into contact therewith, while the tapered surface 236 mates with the tapered surface 110" of the interior surface 110 when the heatsink is urged into contact therewith.

When the SMA washer 122 is below its transition temperature, it is flat (FIG. 5a). In this state, the Belleville washer 112 holds the heatsink assembly 36 against the shallow taper 110' on the interior 110 of the missile skin 10 to the right of the center of the heatsink 36. This allows a large area for heat to transfer from the heatsink 36 to the missile skin 10, along tapered surface 136. When the missile is launched, the skin 10 rapidly heats up. As this happens, the SMA washer 122 also heats up. When the SMA washer 122 reaches its transformation temperature, it deforms into a Belleville-like washer (FIG. 5b). The SMA washer 122 overcomes the opposing Belleville washer 112 and forces the heatsink assembly 36 into contact on the other, steeper taper 110". This steeper taper 110" has several advantages: It has a smaller area than the shallower taper 110'. This leads to reduced heat transfer. Also, the Belleville washer 112 is sandwiched between the heatsink 36 and the skin 10. This creates two interfaces as opposed to one, further impeding heat transfer. Furthermore, the steeper taper 110' could be intermittent, further reducing contact area.

Other embodiments are possible. For example, the same configuration may be used in commercial applications for fire protection of electronics that detect a fire and send a signal of the fire's existence. In such a situation, the electronics would be isolated from the fire by the thermal diode of the present invention long enough to detect the fire and to send the necessary signals.

The key feature of the present invention is that the shape-memory alloy acts as a sensor (of missile skin temperatures or other external temperatures) and actuates the heatsink to move it out of good thermal contact with the skin (or external environment) when the skin/external environment exceeds a certain temperature. The range of transition temperatures available from various alloys and treatments of shape memory alloys provides much latitude in optimizing the system for different types of missiles and anticipated external conditions.

Industrial Applicability

The shape-memory alloy actuators/washers of the present invention are expected to find use as thermal diodes in controlling the flow of heat in environments that are alternatively relatively hot and cold.

What is claimed is:

1. A passively operated thermal diode for controlling heat transfer from heat-generating electronic components to an external environment through an airframe, said thermal diode comprising:

(a) an electronics package within said airframe;

(b) a heat-transferring mechanism thermally connected to said electronics package and controllably disengagable from thermal contact with said airframe at a predetermined temperature;

(c) a shape-memory alloy component having a phase change at said predetermined temperature for thermally disconnecting said electronics package from said airframe once said predetermined temperature is exceeded while remaining in thermal contact with said airframe; and (d) a spring for maintaining said heat-transferring mechanism in thermal contact with said airframe below said predetermined temperature.

2. The thermal diode of claim 1 wherein:

(a) said electronics package is provided with at least one first tapered surface;

(b) said heat-transferring mechanism is provided with at least one second tapered surface that slidably mates with said at least one first tapered surface;

(c) said shape-memory component comprises an actuator for thermally disconnecting said heat transferring mechanism from said airframe once said predetermined temperature is exceeded; and (d) said spring maintains said heat-transferring mechanism in thermal contact with said airframe below said predetermined temperature.

3. The thermal diode of claim 1 wherein:

(a) a portion of an inner surface of said airframe is provided with two tapered surfaces, a first tapered surface having a comparatively large contact area and a comparatively shallow taper and a second tapered surface having a comparatively small contact area and a comparatively steep taper;

(b) said electronics package is thermally connected to a heat sink also provided with two tapered surfaces, a third tapered surface having a comparatively large contact area and a comparatively shallow taper and a fourth tapered surface having a comparatively small contact area and a comparatively steep taper, with said heat sink configured (1) with its third tapered surface opposed to said first tapered surface and with its fourth tapered surface opposed to said second tapered surface and (2) to slidably move from contact of said first and third surfaces to contact of said second and fourth surfaces;

(c) said shape-memory alloy component comprises a washer for thermally disconnecting said heat sink from said first tapered surface once said predetermined temperature is exceeded; and (d) said spring comprises a washer for maintaining said heat sink in thermal contact with airframe below said predetermined temperature.

4. A passively operated thermal diode for controlling heat transfer from heat-generating electronic components to an external environment through an airframe, said thermal diode comprising:

(a) an electronics package provided with at least one first tapered surface;

(b) a heat-transferring mechanism provided with at least one second tapered surface that slidably mates with said at least one first tapered surface;

(c) a shape-memory alloy actuator having a phase change at a predetermined temperature for thermally disconnecting said electronics package from said first tapered surface once said predetermined temperature is exceeded; and (d) a spring for maintaining said heat-transferring mechanism in thermal contact with said airframe below said predetermined temperature.

5. A passively operated thermal diode for controlling heat transfer from heat-generating electronic components to an external environment through an airframe, said thermal diode comprising:

(a) a portion of an inner surface of said airframe provided with two tapered surfaces, a first tapered surface having a comparatively large contact area and a comparatively shallow taper and a second tapered surface having a comparatively small contact area and a comparatively steep taper;

(b) an electronics package thermally connected to a heat sink also provided with two tapered surfaces, a third tapered surface having a comparatively large contact area and a comparatively shallow taper and a fourth tapered surface having a comparatively small contact area and a comparatively steep taper, with said heat sink configured (1) with its third tapered surface opposed to said first tapered surface and with its fourth tapered surface opposed to said second tapered surface and (2) to slidably move from contact of said first and third surfaces to contact of said second and fourth surfaces;

(c) a shape-memory alloy washer having a phase change at a predetermined temperature for thermally disconnecting said heat sink from said first tapered surface once said predetermined temperature is exceeded; and (d) a spring washer for maintaining said heat sink in thermal contact with said airframe below said predetermined temperature.

* * * * *